(12) United States Patent
Bott et al.

(10) Patent No.: US 7,233,059 B2
(45) Date of Patent: Jun. 19, 2007

(54) SEMICONDUCTOR ARRANGEMENT

(75) Inventors: Nikolaus Bott, Villach (AT); Oliver Haeberlen, Villach (AT); Manfred Kotek, Villach (AT); Joost Larik, Villach (AT); Josef Maerz, München (DE); Ralf Otremba, Kaufbeuren (DE)

(73) Assignee: Infineon Technologies AG (DE)

( * ) Notice: Subject to any disclaimer, the term of this patent is extended or adjusted under 35 U.S.C. 154(b) by 84 days.

(21) Appl. No.: 10/850,157

(22) Filed: May 20, 2004

(65) Prior Publication Data

US 2005/0012215 A1    Jan. 20, 2005

(30) Foreign Application Priority Data

May 21, 2003  (DE) ................ 103 23 007

(51) Int. Cl.
- H01L 23/02   (2006.01)
- H01L 23/053  (2006.01)
- H01L 23/12   (2006.01)
- H01L 23/48   (2006.01)
- H01L 23/52   (2006.01)

(52) U.S. Cl. ............. 257/685; 257/684; 257/686; 257/700; 257/737; 257/738; 257/752; 257/753; 257/777; 257/778; 257/783; 257/792

(58) Field of Classification Search ........ 257/737–738, 257/752, 777, 684–686, 700, 753, 778, 783, 257/792

See application file for complete search history.

(56) References Cited

U.S. PATENT DOCUMENTS

| | | | |
|---|---|---|---|
| 4,947,234 A | | 8/1990 | Einzinger et al. ........... 257/500 |
| 5,898,224 A | * | 4/1999 | Akram ........................ 257/778 |
| 6,256,207 B1 | * | 7/2001 | Horiuchi et al. ............ 361/760 |
| 6,259,155 B1 | * | 7/2001 | Interrante et al. .......... 257/690 |
| 6,518,662 B1 | * | 2/2003 | Smith et al. ................. 257/724 |
| 6,552,421 B2 | * | 4/2003 | Kishimoto et al. ......... 257/678 |
| 6,630,735 B1 | * | 10/2003 | Carlson et al. ............. 257/734 |
| 6,717,252 B2 | * | 4/2004 | Saeki .......................... 257/686 |
| 6,784,023 B2 | * | 8/2004 | Ball ............................. 438/113 |
| 6,791,168 B1 | * | 9/2004 | Connell et al. ............. 257/668 |
| 6,833,628 B2 | * | 12/2004 | Brandenburg et al. ...... 257/778 |
| 2002/0017730 A1 | * | 2/2002 | Tahara et al. ............... 257/786 |
| 2002/0076852 A1 | * | 6/2002 | Paulus et al. ............... 438/110 |
| 2002/0158110 A1 | * | 10/2002 | Caletka et al. ......... 228/180.22 |
| 2003/0017648 A1 | * | 1/2003 | Pierson ....................... 438/110 |
| 2003/0102560 A1 | * | 6/2003 | Kim et al. .................. 257/737 |
| 2003/0141529 A1 | * | 7/2003 | Seto et al. .................. 257/299 |

* cited by examiner

*Primary Examiner*—Ida M. Soward
(74) *Attorney, Agent, or Firm*—Dicke, Billig & Czaja, P.L.L.C.

(57) ABSTRACT

The invention relates to a vertical arrangement of at least two semiconductor components which are electrically insulated from one another by at least one passivation layer. The invention likewise relates to a method for fabricating such a semiconductor arrangement. A semiconductor arrangement is specified in which, inter alia, the risk of cracking at the metallization edges, for example, caused by thermomechanical loading, is reduced and the fabrication-dictated high content of radical hydrogen is minimized. Furthermore, a method for fabricating such a semiconductor arrangement is specified.

8 Claims, 2 Drawing Sheets

SEMICONDUCTOR ARRANGEMENT

CROSS-REFERENCE TO RELATED APPLICATIONS

This Utility Patent Application claims priority to German Patent Application No. DE 103 23 007.6, filed on May 21, 2003, which is incorporated herein by reference.

BACKGROUND

The present invention relates to a vertical arrangement of at least two semiconductor components that are electrically insulated from one another by at least one passivation layer. The invention likewise relates to a method for fabricating such a semiconductor arrangement.

One example of such multichip semiconductor component arrangements is the chip-on-chip mounting of control ICs on the cell array of power transistors. Such an arrangement requires a correspondingly robust protective layer on the base chip (power transistor) in order to protect the latter from mechanical damage during mounting and later thermomechanical loading during operation of the components. At the same time, however, said protective layer is required to have no disadvantageous effects, or at any rate the least disadvantageous effects possible, on the reliability of the base chip, such as the drift of component parameters over the lifetime of the semiconductor component. Suitable materials for said passivation layer are materials with good properties as an electrical insulator, mechanical resistance and as a diffusion barrier, such as, silicon nitride, silicon oxide, boron nitride and diamond.

U.S. Pat. No.4,947,234 describes an arrangement comprising a power semiconductor chip and a control circuit integrated in a second semiconductor chip. In this case, the semiconductor chip of the control circuit is applied to one of the top sides of the power semiconductor chip, the two semiconductor chips being connected to one another by an insulating layer, also passivation layer, and a soldering layer. The semiconductor chip with the control circuit is connected to the power semiconductor chip via electrical lines. The passivation layer, for example, a silicon nitride layer, usually has a uniform thickness of between 800 and 1600 nm over the entire semiconductor arrangement. By virtue of the different—by approximately a factor of 10—thermal expansion coefficients of the electrical lines made of an aluminum alloy or the molding composition of the housing and the relatively thick passivation layer, high thermomechanical loading arises, for example, when soldering in the semiconductor component, and may lead to cracks at the edges of the metallization. The cracks produced in this way may be transmitted to the power semiconductor component by the intermediate oxide and lead here to leakage currents or short circuits in the device. This effect is all the more pronounced, the thicker the passivation layers.

In order to protect the base chip, for example, the power transistor, adequately from mechanical loading of the top chip, for example, a control IC, the thickness of the passivation layer is typically limited to a minimum of 800 nm. Such mechanical loading by the top chip, so-called imprints, may originate inter alia from movements of the top chip, caused by, for example, thermal or mechanical loading of the housing. Depending on the method for fabricating the passivation layer, a further disadvantage may result from the use of thick passivation layers in that a high content of radical hydrogen intensifies the threshold voltage drift of the MOS transistor after high-temperature gate stress.

SUMMARY

One embodiment of the present invention specifies a semiconductor arrangement in which the risk of cracking at the metallization edges, caused for example by thermomechanical loading, is reduced and the fabrication-dictated high content of radical hydrogen is minimized. Furthermore, a method for fabricating such a semiconductor arrangement is specified.

In one embodiment, a semiconductor arrangement comprises a lower semiconductor component with a first surface and at least one upper semiconductor component in a housing. An electrically insulating layer is arranged partially on the first surface of the lower semiconductor component. Electrically conductive regions are connected to the upper semiconductor component by a first passivation layer being arranged on said electrically insulating layer. The first passivation layer has the largest thickness essentially below the upper semiconductor component.

By virtue of a semiconductor arrangement formed in this way, the passivation layer may be embodied in a form such that it has a smaller thickness at the edges of the metallization than below the upper semiconductor component to be insulated. By virtue of the small thickness, typically between 40 to 200 nm, of the passivation layer, for example, silicon nitride, it is possible to reduce the thermomechanical loading at the edges of the metallization, due to the different thermoexpansion coefficients of the metallization material or the molding composition and the material of the passivation layer. The reliable electrical insulation of base chip and top chip is ensured by means of a larger thickness of the passivation layer, typically 800 to 1600 nm below the top chip.

In one embodiment of the invention, an adhesion promoter layer is arranged on the electrically conductive region that is not covered by the first passivation layer and/or the upper semiconductor component. This ensures that, even in the event of an increase in the operating temperature of base and top chip, the probability of the housing being detached from the semiconductor arrangement is reduced.

In another embodiment of the invention, the adhesion promoter layer comprises an oxide of the metals zinc, chromium or else alloys of said metals. This form of adhesion promotion is known as "OlinA2", as sold for example by Olin Metal Research Laboratories.

In one embodiment, the semiconductor arrangement comprises a lower semiconductor component with a first surface and at least one upper semiconductor component in a housing. An electrically insulating layer is arranged partially on the first surface of the lower semiconductor component. Electrically conductive regions are connected to the upper semiconductor component by means of a polyimide layer above a first passivation layer being arranged on said electrically insulating layer. The first passivation layer has the largest thickness essentially below the upper semiconductor component. In addition to the planarization of the surface of the semiconductor arrangement and the improvement of the electrical insulation of base chip and top chip, the polyimide layer, typically having a thickness of 2500 nm to 10,000 nm, also has the task of improving the adhesion of housing and semiconductor arrangement. This is achieved, on the one hand, by the surface roughness of the imide brought about by the oxygen plasma treatment after the cyclization of the imide and, on the other hand, by the better adhesion of the functional groups of the molding composition to imide than to nitride.

In one embodiment of the invention, a second passivation layer is arranged below the first passivation layer. The second passivation layer has a smaller thickness than the first passivation layer. The second passivation layer is arranged below the first passivation layer and consequently forms an etching stop for the patterning of the first passivation layer and prevents the passivation layers from being etched through right into the intermediate oxide or even into the deep cell region of the base chip. Especially in the case of low-voltage MOS transistors of the new generations, the intermediate oxide of the base chip is so thin that even a partial thinning of said intermediate oxide can no longer be tolerated. Moreover, by virtue of the thinner second passivation layer, the lower semiconductor component, in the case of fabrication by means of plasma-enhanced CVD, is not exposed for as long to a hydrogen-containing plasma, resulting in a reduction of the threshold voltage drift due to incorporated radical hydrogen.

In another embodiment of the invention, a second passivation layer is arranged above the first passivation layer, said second passivation layer having a smaller thickness than the first passivation layer. This thinner passivation layer having a thickness of typically 25 to 40 nm serves to improve the adhesion of the housing or the polyimide on the passivation layer.

In one embodiment of the invention, the first or second passivation layer comprises silicon nitride. Silicon nitride is suitable as a passivation layer owing to its good properties as an electrical insulator and as a diffusion barrier.

In another embodiment of the invention, the first and/or second passivation layer comprises silicon oxide. Depending on the application, it may be advantageous to use silicon oxide as a passivation layer owing to its different properties to silicon nitride as an electrical insulator, for example, lower dielectric constant, and owing to its generally better thermomechanical properties.

In order to fabricate one embodiment of a semiconductor arrangement according to the invention, a lower semiconductor component with a topmost patterned metallization is provided, onto which a first passivation layer is deposited. This first passivation layer is patterned by means of photolithography and a first etching step. A polyimide layer is deposited onto the newly patterned passivation layer and is opened in the contact region by means of photolithography and a second etching step. The upper semiconductor component is then fixed above the passivation layer, which, after patterning, remains only in the regions below the upper semiconductor component, and the entire semiconductor arrangement is sheathed with a molding composition.

In one embodiment of the method according to the invention for fabricating a semiconductor arrangement comprising a lower and at least one upper semiconductor component in a housing, a lower semiconductor component with a topmost patterned metallization is provided. After the deposition of a first passivation layer having a first thickness, a second passivation layer having a second thickness, which is greater than the first thickness, is deposited. This second passivation layer is patterned by means of photolithography and a first etching step. A polyimide layer typically having a thickness of 2500 nm to 10,000 nm is deposited above the now patterned second passivation layer, and is opened together with the first passivation layer in the contact pad region by means of photolithography and a second etching step. The upper semiconductor component is fixed onto the second passivation layer, which, after patterning, remains essentially only in the region below the upper semiconductor component, on the passivation layer, and the entire semiconductor arrangement is sheathed with a molding composition.

In one method, the thickness of the first passivation layer is between 40 and 200 nm and the thickness of the second passivation layer is 800 to 1600 nm. In this case, the passivation layer having the smaller thickness has the function of protecting the underlying base chip from any etching damage. It thus serves as an etching stop for the patterning of the passivation layer having the larger thickness.

In one method according to the invention for fabricating a semiconductor arrangement comprising a lower and at least one upper semiconductor component in a housing, a lower semiconductor component is provided, onto which a metal layer is deposited. Afterward, a first passivation layer having a first thickness is deposited and this passivation layer is patterned by means of photolithography and a first etching step. After heat treatment in a forming gas atmosphere, the metal layer is patterned by means of photolithography and a second etching step. A second passivation layer having a second thickness is subsequently deposited, above which a polyimide layer is formed.

Both the polyimide layer, typically having a thickness of 2500 nm to 10,000 nm, and the second passivation layer are patterned by means of photolithography and subsequently opened in the now uncovered contact pad region by means of a third etching step. The upper semiconductor component is fixed on the lower semiconductor component in such a way that parts of the first passivation layer remain only essentially below the upper semiconductor component. Finally, the entire semiconductor arrangement is sheathed with a molding composition. In the case of this method, the mechanical protective layer is deposited before the patterning of the metallization and is patterned by means of a separate phototechnology. In this case, customary plasma etching methods may advantageously be used since an etching stop on the metallization is present in all regions. As a result of this, it is possible to avoid inadvertent incipient etching or etching through of the intermediate oxide and hence damage to the active cells.

In one method according to the invention, the thicknesses of the passivation layers are chosen such that the first passivation layer has a thickness of 800 to 1600 nm and the thickness of the second passivation layer is 40 to 200 nm. The function of the thin passivation layer in this method is to improve the adhesion of the housing, in particular the molding composition, on the semiconductor arrangement.

The method may be implemented when using a metal layer made of aluminum, silicon or copper or an alloy of these elements, since these materials can be used conformably with conventional fabrication methods.

One material that may be used for the first and/or second passivation layer is silicon nitride. Silicon nitride is suitable since it forms both a good diffusion barrier, a good etching stop and a good electrical insulator.

In one method according to the invention, the first and/or second passivation layer comprises silicon oxide. On account of the better thermomechanical properties, this permits the use of thicker layers of between 1000 and 5000 nm, as a result of which, when using an adhesion promoter based for example on OlinA2—OlinA2 treatment—on all the conductive regions of the chip, the second thin passivation layer and the polyimide may be obviated.

In one method for fabricating a semiconductor arrangement comprising a lower and at least one upper semiconductor component in a housing, a lower semiconductor component is provided and a metal layer is deposited thereon. After the deposition of a passivation layer, the latter is patterned by means of photolithography and a first etching step. Heat treatment in a forming gas atmosphere is followed by the patterning of the metal layer by means of photolithography and a second etching step. The upper semiconductor component is fixed on the passivation layer of the lower semiconductor component in such a way that the passivation layer remains essentially only below the upper semiconductor component.

The upper semiconductor component is electrically connected to the lower semiconductor component, the base chip. This electrical connection may be produced, for example, by means of a contact wire, the so-called wire bonding method. In order nevertheless to ensure a good adhesion of molding composition in the semiconductor arrangement, an adhesion promoter layer is applied, for example, autocatalytically on the areas that are conductively connected to one another, by means of OlinA2 treatment. This method does not require a polyimide layer between lower semiconductor component and upper semiconductor component.

In one method, the adhesion promoting layer comprises an oxide of the metals zinc, chromium or else the alloys thereof. The use of the inorganic zinc-chromium adhesion promoting layer is suitable in order to prevent so-called bubble formation between semiconductor arrangement and molding composition. A suitable method for fabricating said adhesion promoting layer is electrolytic deposition by means of an electroplating process. The subsequent methods, such as bonding, could be adversely affected by the high thermal stability of the adhesion promoting layer. It is advantageous, therefore, for the deposition of the adhesion promoter layer, to mask the regions to be protected or to partially remove them subsequently.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
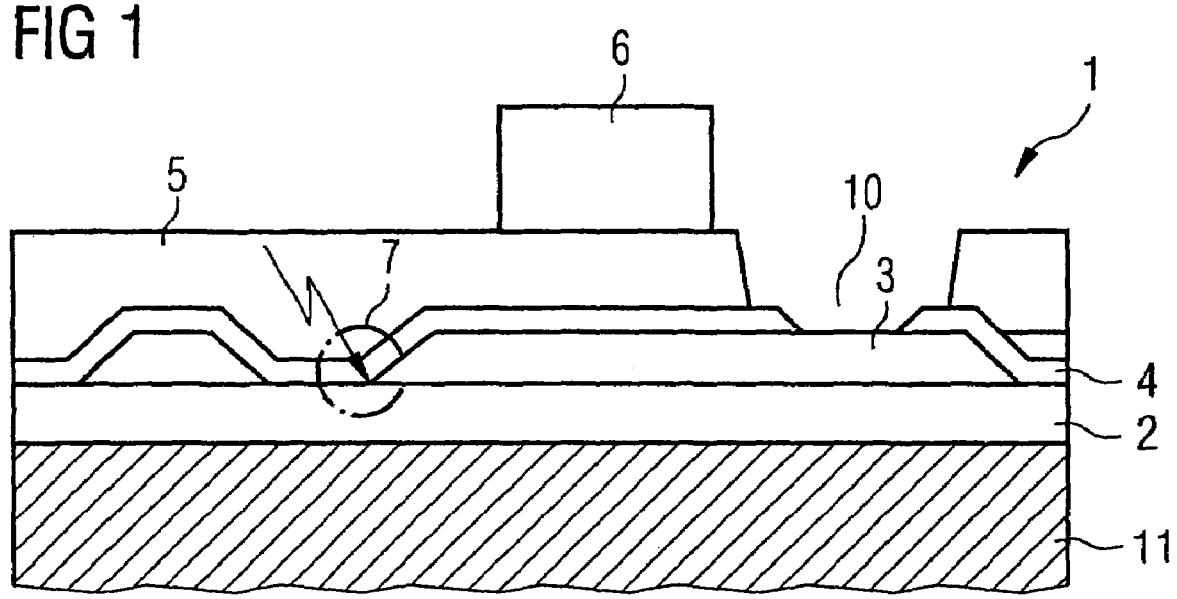
FIG. 1 illustrates a semiconductor arrangement according to the prior art.

FIG. 1 illustrates a cross section through a semiconductor arrangement 1 according to the prior art. An intermediate oxide layer 2 has been arranged on the active cell region 11 of the lower semiconductor component. For the purpose of making electrical contact with the lower semiconductor component, a metal layer 3 has been deposited on the intermediate oxide and suitably patterned. As electrical insulation of the mechanical protection, a passivation layer 4 having a thickness of approximately 800 to 1600 nm and a polyimide layer 5 have been deposited above the metallization 3 and correspondingly patterned in order to produce electrical contacts. The upper semiconductor component 6, also called topchip, has been fixed on the polyimide 5, typically having a thickness of 2500 nm to 10,000 nm. The thick polyimide layer and thick passivation layer prevent mechanical damage due to possible laying on edge, caused for example, by defective fitting of the upper semiconductor component or else due to movements with a thermal cause. Due to the different thermal expansion coefficients of the metal layer 3 and the passivation layer 4, for example, silicon nitride or silicon oxide, delamination of the passivation layer at the transitions 7 from metal to the passivation layer and destruction of the passivation layer at these locations may occur.

Figure 2:
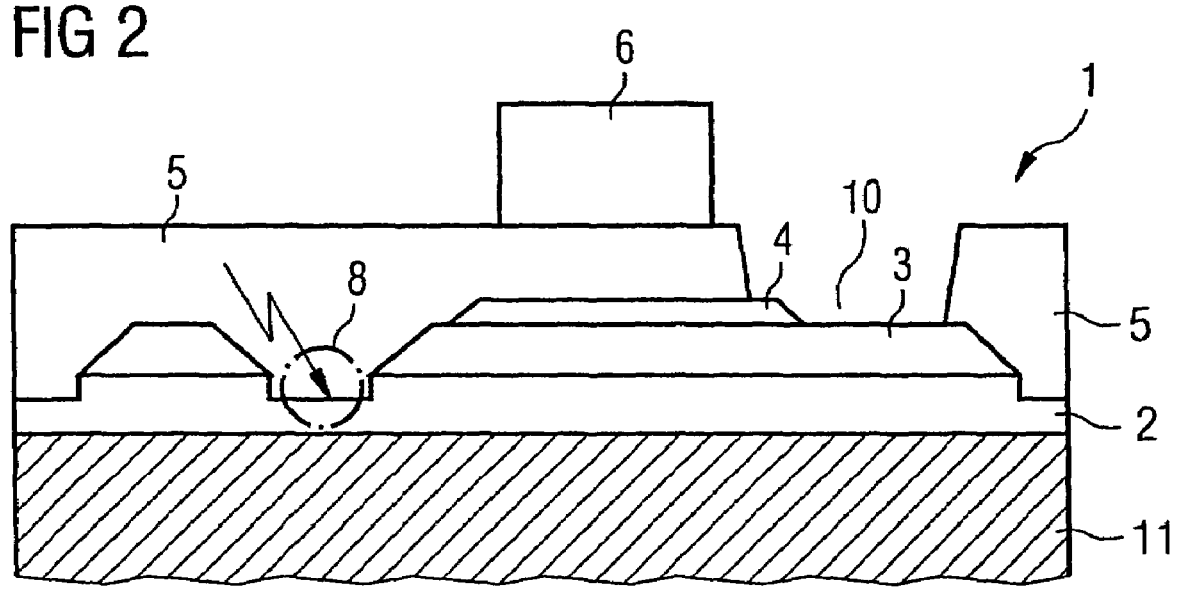
FIG. 2 illustrates a semiconductor arrangement with a passivation essentially only in a region below the top chip.

FIG. 2 illustrates, by way of example, a semiconductor arrangement 1 in which the passivation layer 4 is arranged essentially only below the upper semiconductor component. In order to fabricate this semiconductor arrangement, after the deposition of the metal layer 3, the passivation layer 4 is deposited and suitably patterned. Only after the patterning of the passivation layer is the metal layer 3 patterned. Due to the absence of a layer which stops the etching or patterning of the metal layer 3, it might happen in the case of this method that not only the metal but also the intermediate oxide 2 is concomitantly etched. In the case of modern fabrication processes, however, the intermediate oxide is chosen to be very thin, so that the active region 11 of the lower semiconductor component might also be damaged due to possible incipient etching of said intermediate oxide 2.

Figure 3:
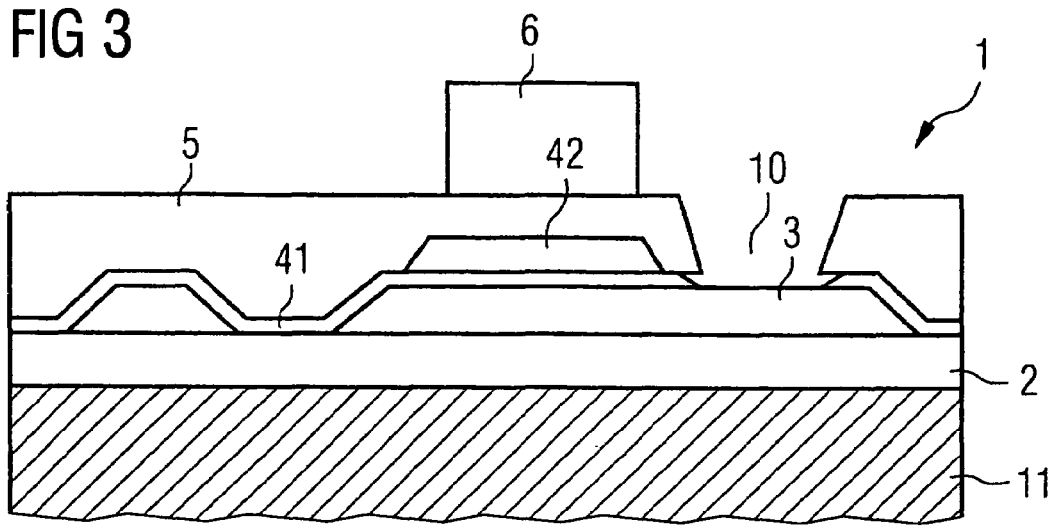
FIG. 3 illustrates a semiconductor arrangement with a passivation having the largest thickness essentially only in a region below the top chip.

FIG. 3 illustrates, by way of example, a further embodiment of a semiconductor arrangement 1 with a thin passivation layer 41 and a thick passivation layer 42, said thick passivation layer 42 being arranged essentially only in the region below the upper semiconductor component. In order to fabricate this semiconductor arrangement, the thin passivation layer 41, for example, having a thickness of 20 to 80 nm, is applied to the patterned metal layer 3. After the application and patterning of the passivation layer 42 having a thickness of approximately 800 to 1600 nm, the thin passivation layer 41 simultaneously serves as an etching stop. This method can prevent damage to the intermediate oxide and thus also possibly to the active cell region 11 of the lower semiconductor component.

Figure 4:
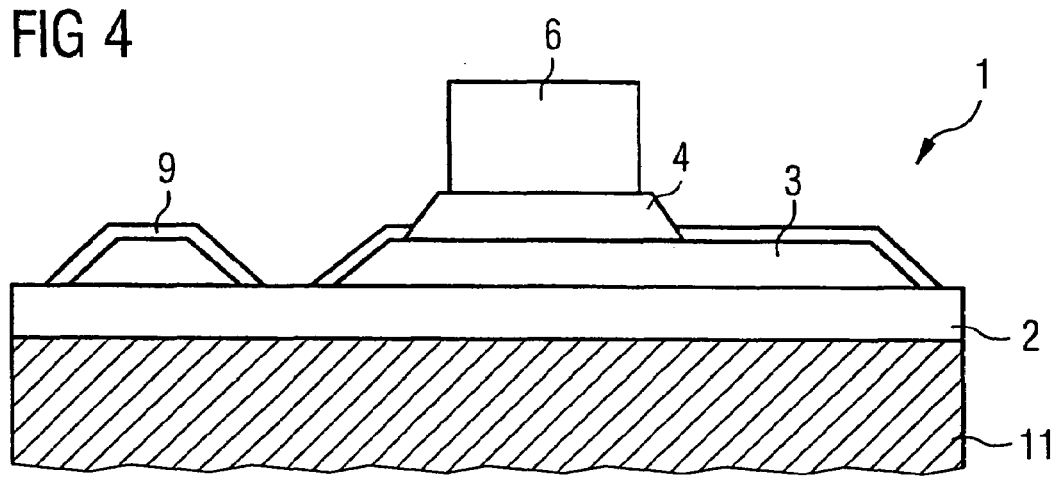
FIG. 4 illustrates a semiconductor arrangement with a passivation essentially only in a region below the top chip and an adhesion promoter layer.

FIG. 4 illustrates, by way of example, a semiconductor arrangement 1 in which the upper semiconductor component 6 is fixed directly on the passivation layer 4 without a polyimide layer. In order to fabricate this semiconductor arrangement, the mechanical protective layer 4 required below the upper semiconductor component is deposited before the patterning of the metallization and is patterned by means of a separate phototechnology. In this case, customary plasma etching methods may be used since an etching stop on the metallization is present in all regions. The metallization is then patterned by means of a further lithography step. Both silicon nitride fabricated by means of a plasma-enhanced CVD method and silicon oxide are suitable as material for the passivation layer 4. Silicon oxide has the advantage that, due to the dictates of the fabrication, less hydrogen is incorporated into the semiconductor component and a possible threshold voltage drift is thus reduced. A good adhesion of the housing molding composition on the uncovered chip regions is ensured by the deposition of an adhesion promoter layer 9.

Figure 5:
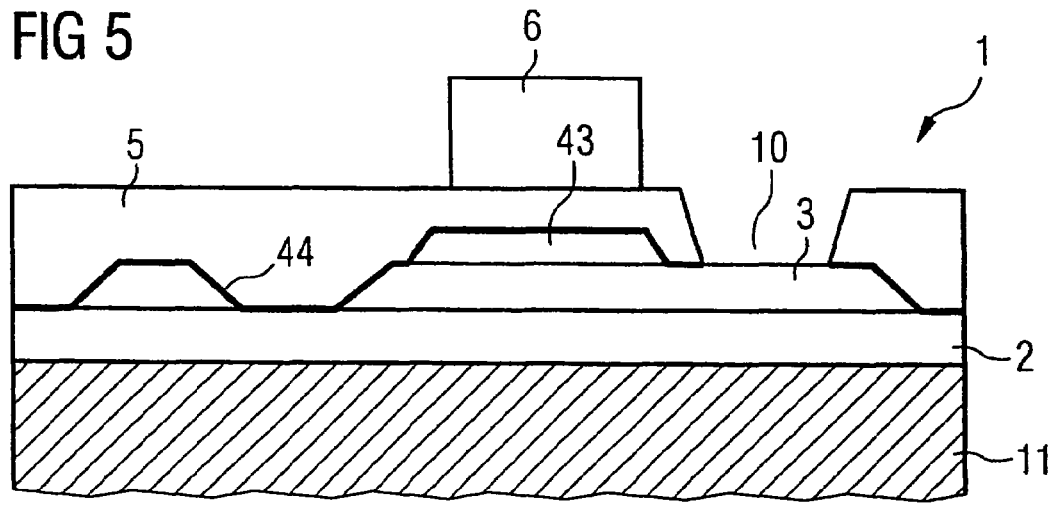
FIG. 5 illustrates a semiconductor arrangement with a subsequently patterned metal layer.

FIG. 5 illustrates a semiconductor arrangement 1 with a thick passivation layer 43, which is arranged essentially only in the region below the upper semiconductor component, and a thin passivation layer 44 which extends over the entire lower semiconductor component and essentially serves to improve adhesion of the polyimide layer 5 on the lower semiconductor component. For the concluding contact-connection of the lower semiconductor component, it is necessary to open both the polyimide layer 5 and the thin passivation layer 44 in the region of the contact pads 10.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor arrangement comprising:
  a lower semiconductor component with a first surface;
  at least one upper semiconductor component in a housing;
  an electrically insulating layer being arranged partially on the first surface of the lower semiconductor component; and
  electrically conductive regions connected to the upper semiconductor component by a first passivation layer being arranged on said electrically insulating layer;
  wherein the first passivation layer has the largest thickness essentially directly below the upper semiconductor component.

2. A semiconductor arrangement comprising:
  a lower semiconductor component with a first surface;
  at least one upper semiconductor component in a housing;
  an electrically insulating layer being arranged partially on the first surface of the lower semiconductor component; and
  electrically conductive regions connected to the upper semiconductor component by a first passivation layer being arranged on said electrically insulating layer;
  wherein the first passivation layer has the largest thickness essentially below the upper semiconductor component; and
  wherein an adhesion promoter layer is arranged on the electrically conductive regions that are not covered by the first passivation layer or the upper semiconductor component.

3. The semiconductor arrangement of claim 2, wherein the adhesion promoter layer comprises an oxide selected from the group comprising metals zinc, chromium, and the alloys thereof.

4. A semiconductor arrangement comprising:
  a lower semiconductor component with a first surface;
  at least one upper semiconductor component in a housing;
  an electrically insulating layer being arranged partially on the first surface of the lower semiconductor component; and
  electrically conductive regions connected to the upper semiconductor component by means of a polymide layer above a first passivation layer being arranged on said electrically insulating layer;
  wherein the first passivation layer has the largest thickness essentially directly below the upper semiconductor component.

5. The semiconductor arrangement of claim 4, wherein a second passivation layer is arranged below the first passivation layer, the second passivation layer having a smaller thickness than the first passivation layer.

6. The semiconductor arrangement of claim 4, wherein a second passivation layer is arranged above the first passivation layer, the second passivation layer having a smaller thickness than the first passivation layer.

7. The semiconductor arrangement of claim 5, wherein the first or second passivation layer comprises silicon nitride.

8. The semiconductor arrangement of claims 5, wherein the first or second passivation layer comprises silicon oxide.

* * * * *

UNITED STATES PATENT AND TRADEMARK OFFICE
CERTIFICATE OF CORRECTION

PATENT NO.         : 7,233,059 B2                                     Page 1 of 1
APPLICATION NO. : 10/850157
DATED              : June 19, 2007
INVENTOR(S)        : Nikolaus Bott et al.

It is certified that error appears in the above-identified patent and that said Letters Patent is hereby corrected as shown below:

Title page, item (30) under Foreign Application Priority Data, delete "103 23 007" and insert in place thereof --103 23 007.6--.

Column 8, line 32, delete "polymide" and insert in place thereof --polyimide--.

Column 8, line 36, delete "directly".

Signed and Sealed this

Ninth Day of September, 2008

JON W. DUDAS
*Director of the United States Patent and Trademark Office*